United States Patent [19]

Uenishi et al.

[11] Patent Number: 5,363,797
[45] Date of Patent: Nov. 15, 1994

[54] METHOD FOR PRODUCING ORGANIC CRYSTAL AND CRYSTAL GROWTH CELL THEREFOR

[75] Inventors: Naota Uenishi; Takafumi Uemiya; Yo Shimizu; Akira Mizoguchi; Yasuji Oogaki; Yasuhiro Hattori, all of Osaka; Shinsuke Umegaki, Kanagawa, all of Japan

[73] Assignee: Sumitomo Electric Industries, Ltd., Osaka, Japan

[21] Appl. No.: 879,105

[22] Filed: May 4, 1992

Related U.S. Application Data

[63] Continuation of Ser. No. 431,104, Nov. 3, 1989, abandoned.

[30] Foreign Application Priority Data

Nov. 5, 1988 [JP] Japan ............................. 63-280118
Jan. 19, 1989 [JP] Japan ............................. 1-11449
Aug. 21, 1989 [JP] Japan ............................. 1-215191

[51] Int. Cl.$^5$ ............................................. C30B 7/02
[52] U.S. Cl. ............................................. 117/68; 117/70; 117/925; 117/941
[58] Field of Search ............................. 156/600, 608, 616.3, 156/616.4, 616.41, 621, 624, DIG. 113; 422/248

[56] References Cited

U.S. PATENT DOCUMENTS 4,847,053 7/1989 Pastor et al. ............................. 422/249
4,887,884 12/1989 Hayden ............................. 252/585

FOREIGN PATENT DOCUMENTS 62-3230 1/1987 Japan ............................. 156/600
63-50400 3/1988 Japan ............................. 156/600

OTHER PUBLICATIONS

Karl, "High Purity Organic Molecular Crystals" in *Crystals* vol. 4, Freyhardt editor Springer-Verlag New York, 1980 pp. 48-53 and 68 to 70.
Ballentyne et al "The Growth of Single Crystals of Electro-Optic Organic Compounds In Monomode Optical Fibers", Jour. of Crystal Growth, vol. 68(1984) pp. 651-655.
McArdle et al., "The Growth and Perfection of Phenanthrene Single Crystals" Journal of Crystal Growth vol. 22 (1974) pp. 193-200.
Journal of Crystal Growth, vol. 48, 1980, pp. 491-492, Amsterdam, NL; D. Ballentyne et al: "The growth of

(List continued on next page.)

*Primary Examiner*—Robert Kunemund
*Attorney, Agent, or Firm*—Sughrue, Mion, Zinn, Macpeak & Seas

[57] ABSTRACT

A method for producing an organic crystal is disclosed. One embodiment comprises maintaining a capillary tube containing a fused liquid of an organic crystal material and having a fused liquid reservoir at one end thereof at a temperature not less than the fusion point of the organic crystal material together with the fused liquid reservoir, reducing the temperature of the fused liquid in the fused liquid reservoir to precipitate seed crystals, and then slowly cooling the capillary tube successively from the end toward the other end to allow a single crystal to grow from the seed crystal in the capillary tube. Because of the large quantity of the fused liquid, a seed crystal can be formed and allowed to grow even from a fused liquid of an organic crystal material which hardly crystallizes in the form of a fused liquid. Another embodiment comprises charging a solution of an organic crystal material in a capillary tube under heat, rapidly reducing the temperature of one end of the capillary tube to precipitate polycrystals, and then slowly cooling the capillary tube successively from the end toward the other end to allow a single crystal to grow from the polycrystal as a seed crystal. A seed crystal grows from a solution of an organic crystal material under control of crystal form to obtain a single crystal which has no inversion symmetry center, is free from lattice defect or rearrangement, and less causative of a laser beam loss.

21 Claims, 7 Drawing Sheets

OTHER PUBLICATIONS electooptic organic crystals in monomode optical fibres", month unknown.

Journal of Crystal Grwoth, vol. 37, No. 2, Feb. 1977, pp. 116–128, Amsterdam, NL; J. L. Stevenson: "Growth and characterisation of single crystal optical fibre waveguides".

Applied Physics Letters, vol. 51, No. 19, Nov. 1987, pp. 1484–1486, New York, U.S.; J. C. Baumert et al "Crystal growth and characterization of 4-(N,N-dimethylamino)-3-acetamidonitrobenzene, a new".

Journal of Materials Science, vol. 12, No. 5, 1977, pp. 869–872, London, GB; F. Babai et al: "Crystal growth of organic materials in glass capillaries". Month unknown.

METHOD FOR PRODUCING ORGANIC CRYSTAL AND CRYSTAL GROWTH CELL THEREFOR

This is a continuation of application No. 07/431,104 filed Nov. 3, 1989 now abandoned.

FIELD OF THE INVENTION

This invention relates to a method for producing an organic crystal, and more particularly to a method for producing an organic crystal exhibiting secondary non-linear optical effects which is suitable for use in the production of a wavelength converting element, etc. and to a growth cell for growth of an organic crystal which can be used for carrying out the method.

BACKGROUND OF THE INVENTION

Conventional materials of a wavelength converting element include inorganic materials, e.g., $KH_2PO_4$. Recently, use of organic crystal materials having higher non-linear optical characteristics than inorganic materials, e.g., 2-methyl-4-nitroaniline (hereinafter abbreviated as MNA), 4,5-dimethyl-1,3-dithiol-2-ylidene cyanoacetate, and 1,3-dithiol-2-ylidene cyanoacetate, has also been extending.

Known techniques for producing an organic crystal include a method in which a fused liquid of the crystal is filled in a capillary tube by capillarity, once cooled to crystallize, fused again, and then cooled successively from one end of the capillary tube toward the other end to thereby allow a single crystal to grow in the capillary tube.

This method has been employed particularly for the production of a wavelength converting element which reduces by half the wavelength of a laser beam of, for example, a semi-conductor laser, by secondary harmonic generation (SHG) utilizing Cherenkov radiation.

However, some of the organic crystal materials, such as N-(4-nitrophenyl)-S-prolinol (hereinafter abbreviated as NPP), and N-(5-nitro-2-pyridyl)-S-penylalalinol (hereinafter abbreviated as NPPA), hardly crystallize on cooling of a fused liquid thereof only to be vitrified. Further, some of them, such as 9-methylcarbazole-3-carboxaldehyde, do not crystallize at all.

In addition, a single crystal obtained by crystal growth from a fused liquid of an organic crystal material having non-linear optical effects sometimes has a center of inversion symmetry and exhibits no secondary non-linear optical effects.

Hence, the above-described conventional method fails, in some cases, to produce an organic crystal having secondary non-linear optical effects. Further, since the method involves fusion of an organic crystal material, there is a fear that the organic crystal material is thermally decomposed. Furthermore, according to the method, since the organic crystal material is crystallized at the fusion point, the resulting single crystal is liable to undergo lattice defects or rearrangement, causing a great loss of a laser beam.

SUMMARY OF THE INVENTION

The present inventors have conducted intensive and extensive investigations on organic crystals having secondary non-linear optical effects. As a result, it has now been found that even those organic crystal materials which have been difficult to crystallize from a fused liquid thereof can be crystallized if the fused liquid is used in a large quantity. It has also been found that even where a single crystal obtained by crystal growth from a fused liquid of an organic crystal material does not exhibit secondary non-linear optical effects, a single crystal obtained by crystal growth from a solution of the organic crystal material exhibits secondary non-linear optical effects.

Figure 32:
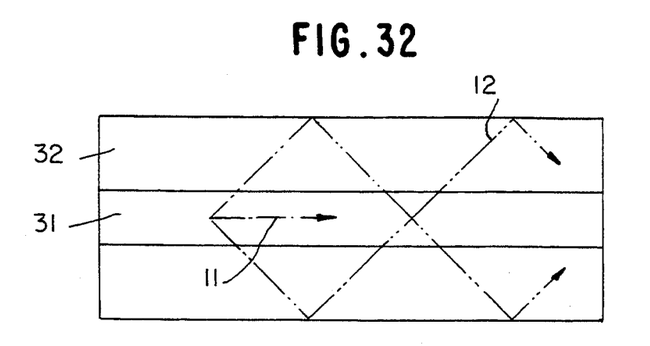
FIG. 32 is a schematic cross-section of an example of a wavelength converting element produced by using the method of the present invention.

On the other hand, in a fiber type wavelength converting element, as shown in FIG. 32, composed of a core 31 comprising an organic non-linear optical crystal having secondary non-linear optical effects and a glass clad 32 having no secondary non-linear optical effects, when the element satisfies formula:

$$n_{clad}(2\omega) > n_{core}(\omega) > n_{clad}(\omega)$$

wherein $n_{clad}(2\omega)$ is a refractive index of the clad in the secondary harmonic; $n_{core}(\omega)$ is an effective refractive index of the core in the basic wave; and $n_{clad}(\omega)$ is a refractive index of the clad in the basic wave, a secondary harmonic is irradiated from the core to the clad by Cherenkov radiation as shown by the arrow 12 in FIG. 32. In FIG. 32, 11 denotes the fundamental wave.

At this time, to improve conversion efficiency from the basic wave to the secondary harmonic, it is necessary to make the direction of polarization of the basic wave consistent with the direction of the maximum non-linear optical constant possessed by the organic crystal constituting the core.

However, in the conventional wavelength converting element composed of a capillary tube as a clad and an organic crystal having secondary non-linear optical effects as a core, where the organic crystal is the one which exhibits satisfactory molecular orientation and whose secondary non-linear optical tensor has a high $d_{ii}$ component, such as 2-methyl-4-nitroaniline (see G. F. Lipscomb et al., *J. Chem.*, Vol. 75, p. 1509 (1981)), 4-nitrobenzylidene-4-methylaniline (see O. S. Filipenko et al., *Sov. Phys. Crystallography*, Vol. 22, p. 305 (1977)), and 2-(α-methylbenzylamino)-5-nitropyridine (see T. Kondo et al., *SPIE Proc.*, Vol. 971, p. 83 (1988)), the direction of the $d_{ii}$ component is consistent with the longer axis direction of the capillary tube, and it is impossible to make the direction of polarization of the incident basic wave consistent with the direction of the maximum non-linear optical constant of the crystal.

Accordingly, an object of this invention is to provide a method for producing an organic crystal from various organic crystal materials, which exhibits non-linear optical effects, particularly secondary non-linear optical effects, and is suitable for use in the production of a wavelength converting element.

Other objects, effects and advantages of the present invention will be apparent from the following description.

A first embodiment of the present invention relates to a method for producing an organic crystal which comprises maintaining a capillary tube containing a fused liquid of an organic crystal material and having a fused liquid reservoir at one end thereof at a temperature not less than the fusion point of the organic crystal material together with the fused liquid reservoir, reducing the temperature of the fused liquid in the fused liquid reservoir to precipitate seed crystals, and then slowly cooling the capillary tube successively from the end toward the other end to allow a single crystal to grow from the seed crystal in the capillary tube.

A second embodiment of the present invention relates to a method for producing an organic crystal which comprises maintaining a capillary tube containing a fused liquid of an organic crystal material and having a fused liquid reservoir at one end thereof at a temperature not less than the fusion point of the organic crystal material together with the fused liquid reservoir, reducing the temperature of the fused liquid in the fused liquid reservoir while the fused liquid is in contact with a seed crystal which is provided outside the heating zone to thereby allow the seed crystal to grow, and then slowly cooling the capillary tube successively from the end toward the other end to allow a single crystal to grow from the seed crystal in the capillary tube.

A third embobiment of the present invention relates to a method for producing an organic crystal which comprises charging a solution of an organic crystal material in a capillary tube under heat, rapidly reducing the temperature of one end of the capillary tube to precipitate polycrystals, and then slowly cooling the capillary tube successively from the end toward the other end to allow a single crystal to grow from the polycrystal as a seed crystal.

A fourth embodiment of the present invention relates to a method for producing an organic crystal which comprises slowly cooling a capillary tube containing a solution of an organic crystal material under heat, the capillary tube being fitted with a seed crystal at one end thereof so that the solution is in contact with the seed crystal, successively from the end toward the other end to allow a single crystal to grow from the seed crystal in the capillary tube.

A fifth embodiment of the present invention relates to a method for producing an organic crystal which comprises slowly cooling a capillary tube containing a fused liquid or solution of an organic crystal material under heat, successively from one end thereof toward the other end with a temperature gradient provided from the inner wall of the capillary tube on one side toward the inner wall on the opposite side to thereby allow a single crystal to grow.

A sixth embodiment of the present invention relates to a method for producing an organic crystal which comprises cooling a capillary tube containing a fused liquid or solution of an organic crystal material under heat, the inner wall of said capillary tube being modified with a coupling agent, successively from one end thereof toward the other end to allow a single crystal to grow.

The present invention further relates to a cell for organic crystal growth useful for carrying out any of the above-described embodiments, which comprises a liquid reservoir in which a solution of an organic crystal material is to be charged, said reservoir having a through-hole at the bottom thereof, and a capillary tube connected to said liquid reservoir with the one end thereof being inserted into said through-hole. The cell for organic crystal growth can be effectively used for the methods of the above third to sixth embodiments of the present invention.

DETAILED DESCRIPTION OF THE INVENTION

According to the first embodiment, a seed crystal is precipitated by cooling a fused liquid of an organic crystal material in the fused liquid reservoir maintained at a temperature not less than the fusion point.

In this embodiment, a seed crystal is formed in the fused liquid in the fused liquid reservoir. Even when the organic liquid material is such a material that hardly crystallizes, a seed crystal can be formed. This is because the amount of the fused liquid is extremely large (about $10^6$ times) in comparison to that of the prior art since the present invention used the liquid reservoir. Then, the fused liquid is slowly cooled in a successive manner toward the other end of the capillary tube to thereby allow the seed crystal to grow in the capillary tube to obtain a single crystal.

According to the second embodiment, the temperature of the fused liquid in the fused liquid reservoir is reduced and then the fused liquid is slowly cooled successively toward the other end of the capillary tube to allow the seed crystal to grow in the capillary tube to obtain a single crystal. Since the temperature reduction of the fused liquid in the reservoir is carried out while the fused liquid is in contact with a seed crystal (which may be produced by any other method such as recrystalization from a solution), even such a fused liquid of an organic crystal material which hardly crystallizes undergoes crystallization.

The temperature at which the reservoir is maintained is preferably a temperature 10° C. higher than the fusion point or lower, and more preferably a temperature 5° C. higher than the fusion point or lower. The slow cooling of the capillary tube is preferably attained by moving the capillary tube at a rate of from 0.1 to 10 mm/hr, more preferably from 1 to 6 mm/hr.

In cases of using an organic crystal material whose fused liquid easily allows a single crystal to grow, since a seed crystal is formed in the bottom part of the capillary tube, formation of polycrystals in the capillary tube due to supercooling can be prevented so that a wide single crystal region can be assured.

According to the third embodiment, rapid temperature reduction at one end of a capillary tube containing a solution of an organic crystal material in a heated state results in the formation of a seed crystal in this part. Subsequent slow cooling of the capillary tube toward the other end causes the seed crystal to grow to obtain a single crystal.

According to the fourth embodiment, slow cooling of the capillary tube successively from one end thereof to which a seed crystal is fitted toward the other end causes the seed crystal to grow to obtain a single crystal having a controlled crystal form. The seed crystal fitted to one end of the capillary tube may be formed from the solution or may separately prepared by deposition from fused liquid or gas phase, and then attached to the end of the capillary tube. The seed crystal must exhibit secondary non-linear optical effect.

In this embodiment, since a single crystal is allowed to grow from a solution of the organic crystal material, even in using an organic crystal material whose fused liquid produces a single crystal exhibiting no secondary non-linear optical effects, it is possible to obtain a single crystal exhibiting secondary non-linear optical effects. Further, since crystallization is effected at a temperature lower than the fusion point of the organic crystal material, the resulting single crystal is free from lattice defects or rearrangement.

According to the fifth embodiment, a fused liquid or solution of an organic crystal material is slowly cooled successively from one end of the capillary tube containing it toward the other end with a temperature gradient provided in the diameter direction. As a result, a single crystal grows from the inner wall of one side of the capillary tube toward the inner wall of the other side along the temperature gradient. Accordingly, the crystal orientation of a single crystal can be controlled by changing the direction of the temperature gradient. The greater the temperature gradient, the easier the control over the crystal orientation.

Figure 29:
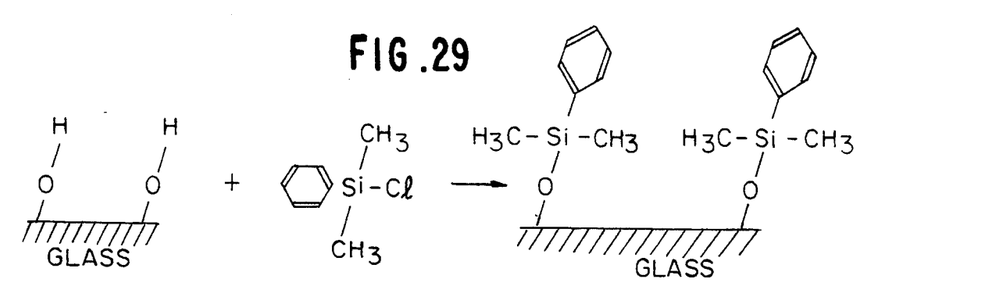
FIG. 29 illustrates the state of bonding of a coupling agent to the surface of an inner wall of a capillary tube.

According to the sixth embodiment, an organic single crystal is allowed to grow in a glass-made capillary tube whose inner wall is modified with a coupling agent. In this embodiment, the coupling agent is bonded to hydroxl groups on the inner wall surface of the capillary tube to form a molecular layer of the coupling agent as schematically shown in FIG. 29. This molecular layer exhibits different properties from the hydroxyl group on the glass surface. For example, in using a titanium coupling agent having three lipophilic groups and one ethoxy group as a modifier, a lipophilic layer is formed on the inner wall surface of the capillary tube to thereby render the glass surface lipophilic. Thus, modification of the glass surface can be conducted arbitrarily by selecting substituents of a coupling agent.

The inner wall surface of the capillary tube being modified, the interaction on the interface changes. Hence, a single crystal having grown in a capillary tube having the thus modified inner wall and that having grown in a capillary tube having an unmodified inner wall are different in direction of crystal growth from each other and thus different in crystal orientation from each other.

Additionally, seed crystal may not be used when an organic crystal material which easily attains crystal growth from a fused liquid is used.

More specifically, when, for example, a monochlorosilane coupling agent is used, the agent is bonded to hydroxyl groups on the glass surface to form a molecular membrane wherein the substituent of the coupling agent is arranged upright on the glass surface as illustrated in FIG. 29. In this particular case, the molecules constituting a single crystal are oriented to the same direction of the substituent of the silane coupling agent.

With the inner wall of a glass capillary tube being modified with a silane coupling agent as described above, in the case where a single crystal of an organic crystal material having a similar structure as the substituents of the silane coupling agent oriented uprightly from the inner wall is allowed to grow in this capillary tube, the single crystal molecules grow to the direction upright from the inner wall.

In cases where a single crystal of an organic crystal material having a large $d_{ii}$ component of the secondary non-linear optical tensor, i.e., having a $d_{ii}$ component direction close to the direction of the molecular main axis is allowed to grow in the capillary tube having the modified inner wall, the angle between the $d_{ii}$ component direction and the longer axis of the capillary tube approaches to 90° so that the maximum non-linear optical constant of the single crystal can be made use of.

Furthermore, the embodiments shown in FIGS. 10 to 15 and FIG. 28 can also be combined so that the crystal orientation of the single crystal can be controlled more stably.

Coupling agents which can be used in this embodiment include those represented by formula (I):

$$R_nMX_{m-n} \qquad (I)$$

wherein M represents silicon, titanium or aluminum; R represents a substituent different in property from the glass surface having a hydroxyl group; X represents a substituent reactive with a hydroxyl group on the glass surface; m represents a valency of M; and n represents an integer smaller than n and larger than 0.

In formula (I), examples of the substituent represented by R include alkyl, alkenyl and alkynyl groups, e.g., methyl, ethyl, propyl, isopropyl, butyl, vinyl, 1-propenyl, allyl, isopropenyl, and ethynyl groups; alicyclic hydrocarbon groups, e.g., cyclopropyl, cyclopentyl, cyclohexyl, and 1-cyclohexenyl groups; aromatic hydrocarbon groups, e.g., phenyl, tolyl, xylyl, benzyl, and naphthyl groups; carboxylic acid ester groups, e.g., methoxycarbonyl and acetoxy groups; acyl groups, e.g., acetyl, propionyl, butyryl, acrylonitrile, and benzoyl groups; nitrogen-containing characteristic groups, e.g., amino and amido groups; heterocyclic groups, e.g., 2-furyl, 2-pyrrole, and 2-pyridyl groups; a hydroxyl group, an epoxy group, a mercapto group, a cyano group, an isocyano group, a cyanate group, a thiocyanate group, a nitro group, a halogen atom, and derivatives derived from these substituents.

Examples of the substituent as represented by X include halogen atoms, e.g., chlorine and bromine, a hydrogen atom, a hydroxyl group, a methoxy group, and an ethoxy group.

Preferred examples of the compounds represented by formula (I) include silane coupling agents wherein M is silicon. More preferred of them are monochlorosilane compounds, with those having at least one substituent having a structure similar to an organic non-linear optical material being particularly preferred.

The crystal growth cell according to the present invention can easily be produced in good yield at low cost by separately preparing a liquid reservoir having a through-hole at the bottom thereof and a capillary tube and inserting one end of the capillary tube into the through-hole to thereby connect them. No other difficult production steps are involved.

Figure 1:
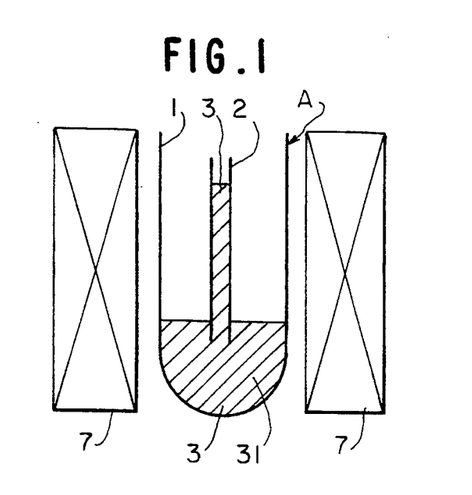
FIGS. 1 to 3 are schematic cross-sections each showing one embodiment of the method according to the present invention.
Figure 2:
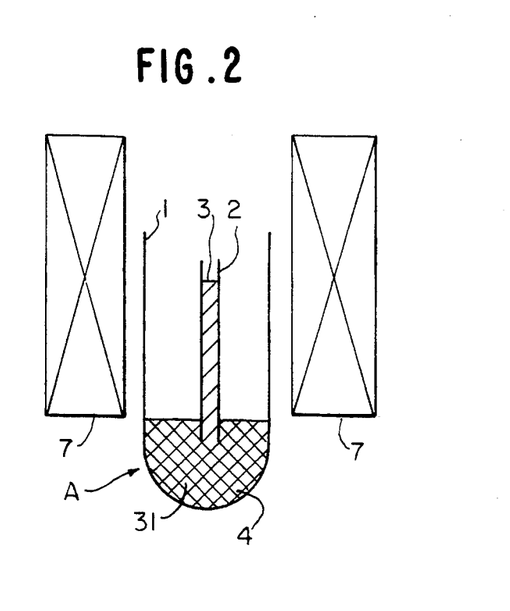
Figure 3:
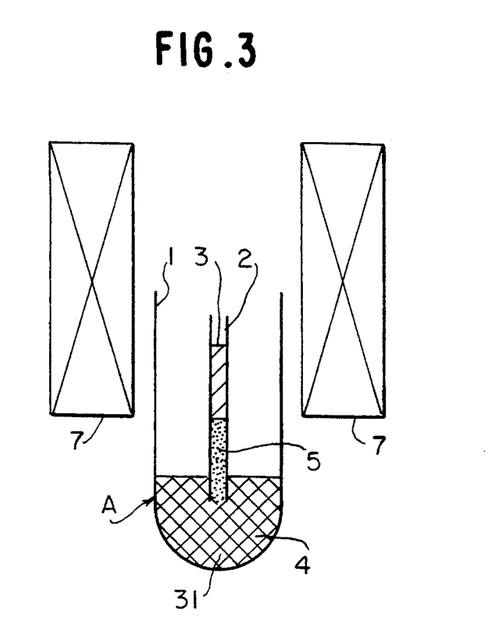

FIGS. 1 through 3 each shows a schematic cross-section of an apparatus for carrying out the first embodiment of the method for producing an organic crystal using a fused liquid of an organic crystal material.

In FIG. 1, crystal growth cell A is an open top container comprising ampule 1 having fused liquid reservoir 31 at the bottom part thereof and capillary tube 2 having open ends. Ampule 1 is held by a holding member not shown in a substantially vertically movable way. Capillary tube 2 is fixed in ampule 1 in such a manner that the axis thereof is parallel to the axis of ampule 1 by a holding member not shown.

Heating furnace 7 is set around cell A so as to heat the cell.

Fused liquid 3 of an organic crystal material exhibiting non-linear optical effects is put in fused liquid reservoir 31 of ampule 1 so that the lower end of capillary tube 2 may be submerged beneath fused liquid 3, whereby capillary tube 2 is filled with fused liquid 3 by capillarity as shown in FIG. 1.

Growth cell A is then shifted down until only the fused liquid reservoir 31 gets outside the heating zone of heating furnace 7, whereby seed crystal 4 is formed in fused liquid reservoir 31 as shown in FIG. 2.

Thereafter, growth cell A is slowly shifted down. According as capillary tube 2 is slowly cooled successively toward the upper end thereof, the fused liquid in capillary tube 2 is slowly cooled, whereby single crystal 5 grows in capillary tube 2 from seed crystal 4 under control of a crystal form as shown in FIG. 3.

In the above-described embodiment, seed crystal 4 is formed in a large quantity of fused liquid 3 in fused liquid reservoir 31. Therefore, even in using a hardly crystallizable fused liquid of an organic crystal material, seed crystal 4 can be formed.

Capillary tube 2 is made of heat resistant materials having no non-linear optical effects, such as quartz glass, lead glass, soda-lime glass, etc. Capillary tube 2 usually has an inner diameter of from 1 to 3 $\mu m$, preferably 1 $\mu m$ or more and a diameter at which the fundametal wave is transmitted in the single mode, and an outer diameter of from 100 $\mu m$ to 1.5 mm, preferably from 1 to 1.5 mm.

The reservoir is not limited in size, and generally a glass tube having an inner diameter of from 1 to 10 mm, preferably from 4 to 6 mm, is used.

Examples of organic crystal materials which can be used in this embodiment of the present invention include MNA, 4,5-dimethyl-1,3-dithiol-2-ylidene cyanoacetate, 1,3-dithiol-2-ylidene cyanoacetate, 3,5-dimethyl-1-(4-nitrophenyl)pyrazole, 4'-nitrobenzylidene-3-acetamido-4-methoxyaniline, 4-bromo-4'-methoxychalcone, and 3-(2-cyano-2-ethoxycarbonylvinyl)indole.

In the production of a wavelength converting element having a core-sheath structure (constituted by a core and a clad) by the above-described embodiment, after single crystal 5 sufficiently grows to form a single crystal region of a prescribed length in capillary tube 2, capillary tube 2 in this region is removed from growth cell A and cut to an appropriate length to obtain a wavelength converting element having a core-sheath structure. Further, by using, as a clad, glass having a refractive index suited for use as a single mode optical fiber, a wavelength converting element of single mode having a core-sheath structure as shown in FIG. 32 can be obtained.

Figure 4:
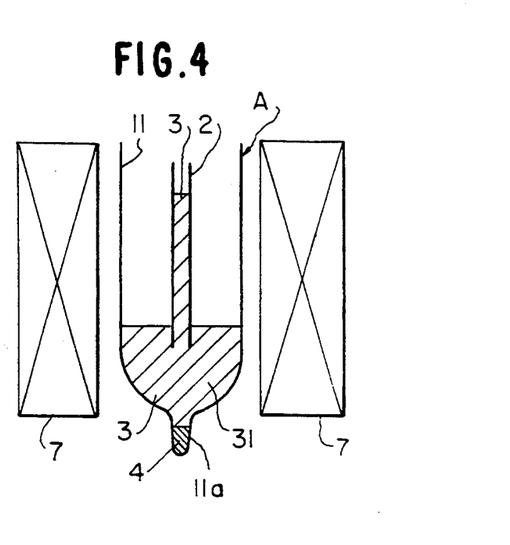
FIGS. 4 to 13 each illustrates a schematic cross-sectional view or a perspective view showing another embodiment of the method according to the present invention.

FIG. 4 is a schematic cross-section of an apparatus which can be used for carrying out the second embodiment of this invention. The apparatus of FIG. 4 is of the similar structure as that of FIG. 1, except that the ampule has a different shape and crystallites 4 as a seed crystal is provided in the ampule. That is, ampule 11 has tapering bottom 11a. The tip of tapering bottom 11a is in the outside of the heating zone of heating furnace 7, and there is provided crystallites obtained by precipitation from a solution of an organic crystal material as seed crystal 4. In the following description relating the apparatus of FIG. 4, explanations about the same or substantially the same elements or members as in the apparatus of FIG. 1 are omitted.

Tepering bottom 11a generally has an inner diameter of from 1 to 2 mm and a length of 5 to 10 mm.

When the apparatus is operated in the same manner as in FIGS. 1 to 3, single crystal 5 grows from fused liquid 3 starting from seed crystal 4 under control of a crystal form. In this embodiment, since fused liquid 3 in fused liquid reservoir 31 is cooled while contacting with the crystallites as seed crystal 4, crystallization of fused liquid 3 can be achieved even in the case where fused liquid 3 is a fused liquid of an organic crystal material which does not crystallize in the form of a fused liquid thereof.

While, in the above-described apparatus for both first and second embodiments, crystal growth is effected in an air atmosphere with the top of ampule 1 or 11 open, for the purpose of preventing thermal decomposition of fused liquid 3, it is possible to perform crystal growth with the top of ampule 1 or 11 closed after evacuation or blowing nitrogen.

Further, while in the above-described apparatus, ampule 1 or 11 is movably fitted with furnace 7 being fixed, heating furnace 7 which is movable substantially vertically may be used so that it is shifted up instead of shifting the ampule down.

Figure 5:
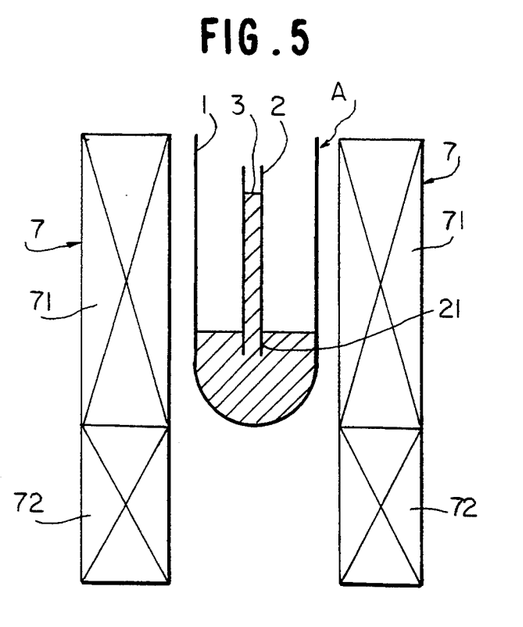

For the purpose of preventing thermal distortion of growth cell A, as shown in FIG. 5, heating furnace 7 to be used in the apparatus of FIGS. 1 or 4 may be composed of high-temperature part 71 kept at a temperature higher than the fusion point of the organic material and low-temperature part 72 kept at a temperature lower than the fusion point. In this case, growth cell A is slowly cooled after it is completely shifted from high-temperature part 71 to low-temperature part 72.

Figure 6:
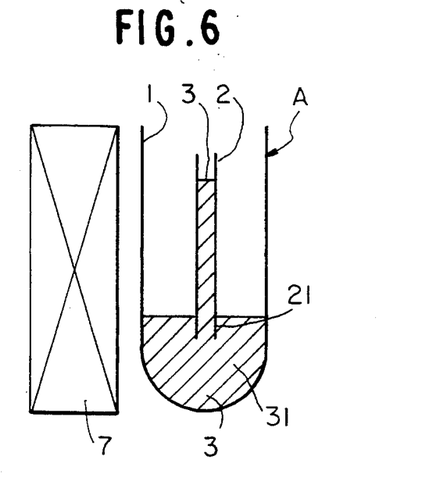
Figure 7:
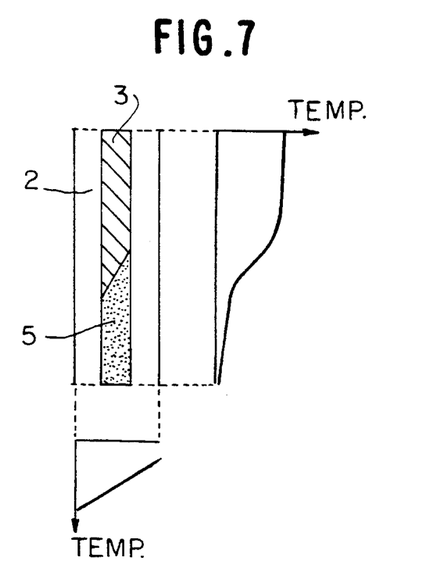

Heating furnace 7 may be provided on only one side of growth cell A as shown in FIG. 6. This being the case, when growth cell A is shifted down to slowly cool capillary tube 2 in a successive manner, a temperature gradient can be provided in the direction of diameter of capillary tube 2 as shown in FIG. 7. As a result, single crystal 5 is growing from one side of capillary tube to the other side in accordance with the temperature gradient provided in the diameter direction.

Crystal orientation of the resulting single crystal depends on the direction of the temperature gradient. Thus, the crystal orientation of single crystal 5 can be controlled by changing the direction of the temperature gradient so as to obtain a single crystal whose maximum non-linear optical constant can be made use of. In addition, the control of crystal orientation can be made easier by increasing the temperature gradient.

Figure 8:
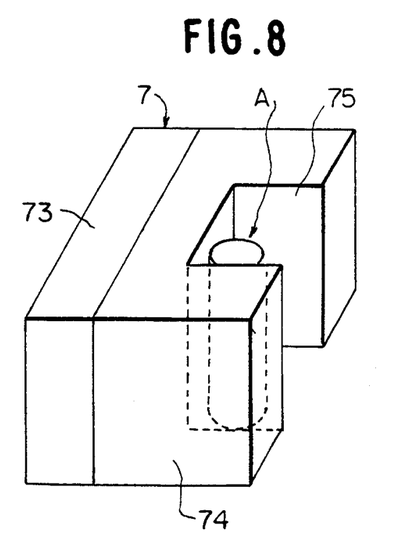
Figures 9, 10, 11, 12, 13, 14, 15:
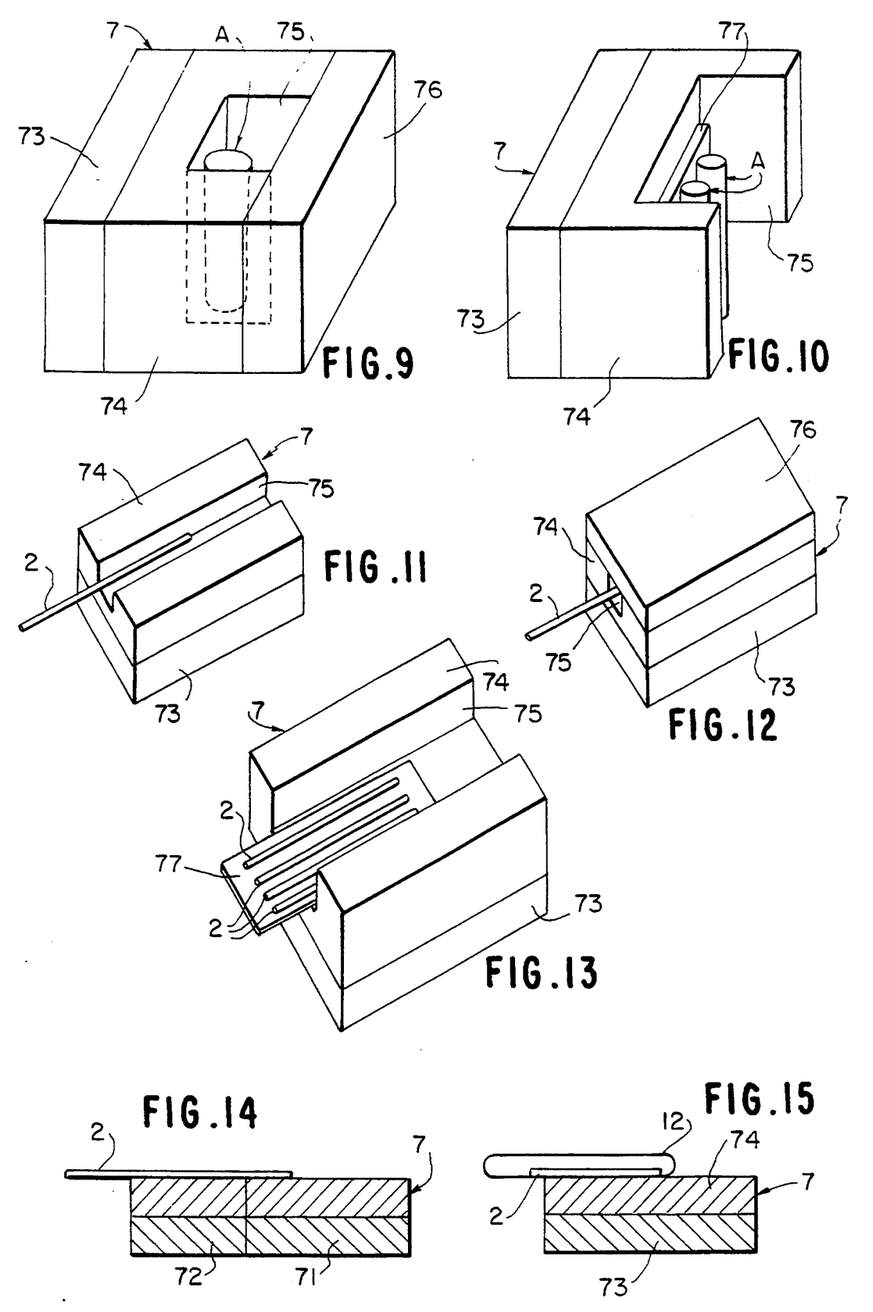
FIGS. 14 to 28 each illustrates a cross-section showing a still another embodiment of the method according to the present invention.

Crystal growth with a temperature gradient may also be performed by using heating furnace 7 of FIG. 8 which is composed of heating plate 73 and metal plate 74 which is provided on a side of heating plate 73 and has depression 75 to place growth cell A in, or heating furnace 7 of FIG. 9 which is composed of heating plate 73, depressed metal plate 74, and metal plate 76 which is provided in front of metal plate 74 to cover depression 75.

If desired, a single crystal of an organic crystal material may grow in a plurality of capillary tubes 2 with a temperature gradient by using heating furnace 7 of FIG. 10, in which glass plate 77 having poor thermal conductivity is provided on the side of heating plate 73, and a plurality of growth cells A are provided in front of glass plate 77.

When an organic crystal material which easily forms a crystal from a fused liquid is used, only the capillary tube containing the organic crystal material is used but the reservoir is used. In this case, in order to increase the temperature gradient in the direction of capillary tube diameter, it is also possible to provide any of the heating furnaces shown in FIGS. 8 to 10 transversely as illustrated in FIGS. 11 to 13, respectively. In these cases, capillary tube 2 filled with a fused liquid of an organic crystal material is put in depression 75, and capillary tube 2 is horizontally moved and drawn out of the heating zone from one end thereof, whereby capillary tube 2 is cooled successively from that end toward the other end. A single crystal of the organic crystal material thus grows in capillary tube 2 in the same manner as in the cases of FIGS. 8 to 10.

Any of the heating furnaces of FIGS. 11 to 13 may comprise a heater at the bottom thereof, an open top, high-temperature part 71 kept at a temperature higher than the fusion point of the organic material, and low-temperature part 72 kept at a temperature lower than the fusion point as illustrated in FIG. 14. By using such a structure, capillary tube 2 can be protected from thermal distortion as stated with reference to FIG. 5.

Further, as shown in FIG. 15, capillary tube 2 filled with a fused liquid of an organic crystal material may be placed in glass ampule 12. Glass ampule 12, after evacuation, is sealed and placed in depression 75 and subjected to crystal growth in the same manner as in any of the cases of FIGS. 11 to 14.

The embodiments shown in FIGS. 11 to 15 are suitably applicable to organic crystal materials which easily crystallize in the form of a fused liquid, such as 2-methyl-4-nitroaniline, 4'-nitrobenzylidene-3-acetamido-4-methoxyaniline, and 3-(2-cyano-2-ethoxycarbonylvinyl-)indole.

The embodiments of the present invention which employ a solution of an organic crystal material are described hereunder.

Figure 16:
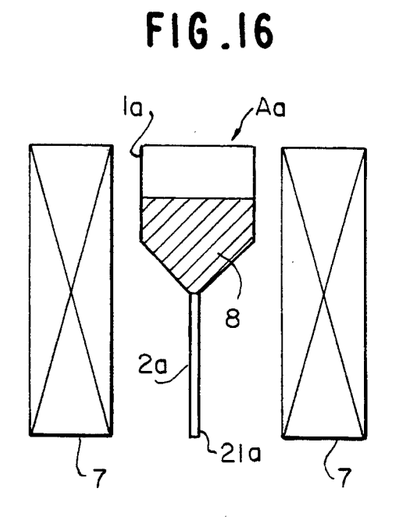

FIGS. 16 through 19 each illustrates a schematic cross-section of an apparatus for carrying out the third embodiment of the present invention. In FIG. 16, growth cell Aa comprises open top liquid reservoir 1a having the shape of a Buchner funnel and capillary tube 2a having open lower end 21a and an inner diameter of not more than 50 μm, the capillary tube being connected to the liquid reservoir. Growth cell Aa is movable in a substantially vertical direction, held by a holding member not shown.

Heating furnace 7 is provided around growth cell Aa so that growth cell Aa may be heated.

Figure 17:
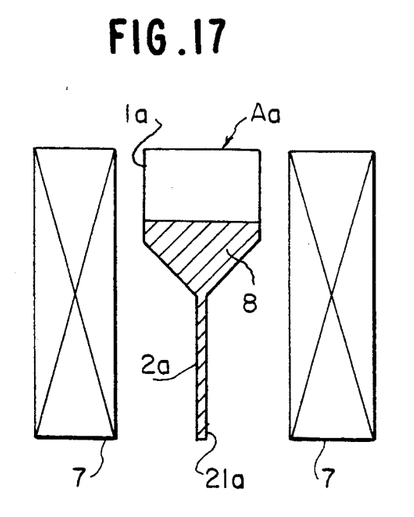

In carrying out the third embodiment using the apparatus of FIG. 16, solution 8 of an organic crystal material exhibiting non-linear optical effects is put in liquid reservoir 1a, and the opening of liquid reservoir 1a is sealed. Then, liquid reservoir 1a is heated above the boiling point of the solvent of solution 8 to raise the inner pressure by the vapor pressure of the solvent whereby, as shown in FIG. 17, solution 8 is pushed down into the inside of capillary tube 2a, reaching to lower end 21a.

Figure 18:
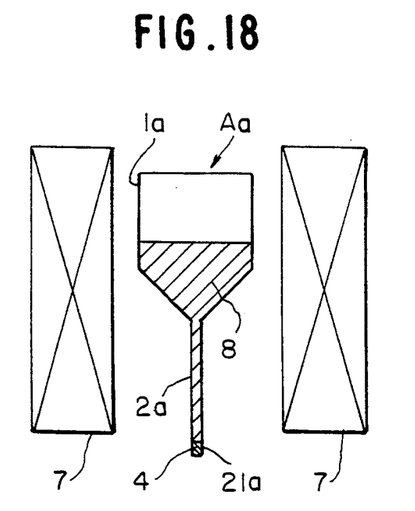

Then, capillary tube 2a is rapidly shifted down until only the lower end 21a is outside the heating zone of heating furnace 7 to precipitate seed crystal 4 on the inner wall of lower end 21a as shown in FIG. 18.

In this embodiment, it is preferred that the liquid reservoir is sealed after charging the solution in the reservoir and the capillary tube; the solution of an organic crystal material is heated to a temperature not lower than the boiling point of a solvent contained in the solution so as to completely dissolve the organic crystal material in the solution; and one end of the capillary tube is opend so that the solution is drained from the capillary tube, and simultaneously the temperature of the end of the capillary tube is rapidly reduced or the solvent of the solution at the end of the capillary tube is evaporated, so as to attach the seed crystal at the end of the capillary tube.

Figure 19:
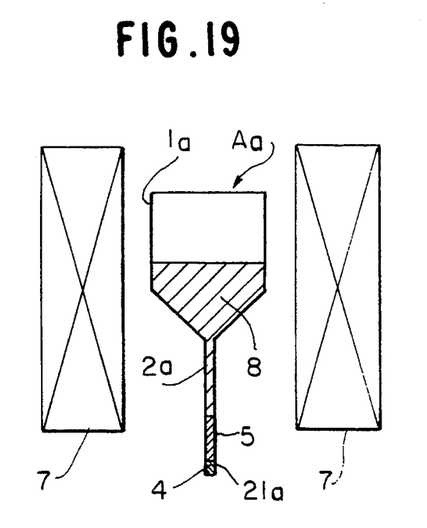
Figure 20:
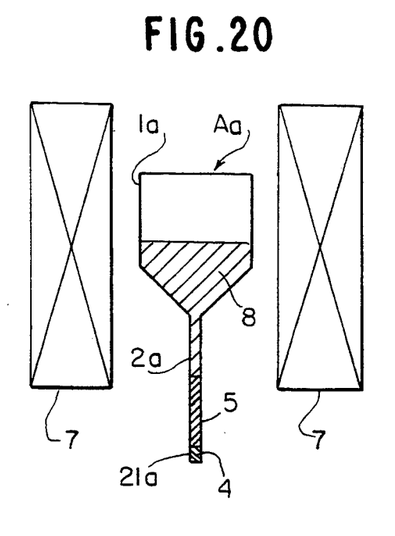

Growth cell Aa is then slowly shifted down to be cooled. According as the capillary tube is cooled successively toward the upper end thereof, solution 8 in the capillary tube is also slowly cooled successively. Thus, single crystal 5 grows from solution 8 starting from seed crystal 4 under control of a crystal form as shown in FIGS. 19 and 20.

Since single crystal 5 thus obtained is the one which has grown in solution 8 starting from seed crystal 4 precipitated from solution 8 by temperature fall, it exhibits secondary non-linear optical effects.

Further, because solution 8 containing the organic crystal material is present not only in capillary tube 2a but in liquid reservoir 1a, even if the concentration of solution 8 in capillary tube 2a is reduced, the organic crystal material dissolved in solution 8 is automatically supplied from liquid reservoir 1a to the boundary between single crystal 5 and solution 8. Thus, by employing growth cell Aa having liquid reservoir 1a, a single crystal region of a length enough to produce a wavelength converting element having a core-sheath structure as shown in FIG. 32 can be formed.

By providing a heating furnace on only one side of growth cell Aa similar to the above-described embodiments, crystal orientation of the resulting single crystal can be controlled and a single crystal having the maximum non-linear potical constant can be grown in capillary tube 2a. The control of crystal orientation can be made easier by increasing the temperature gradient.

The inner wall of capillary tube 2a may also be modified with a coupling agent. In this case, the coupling agent is bonded to hydroxyl groups on the inner wall suface of capillary tube 2a to form a molecular layer of the coupling agent which has properties different from those of the glass surface. Therefore, a single crystal grown in the thus modified capillary tube is different in crystal orientation froma single crystal grown in the unmodified capillary tube.

Because the crystal orientation of single crystal 5 can be controlled by selecting the coupling agent modifying the inner wall of capillary tube 2a, a single crystal whose maximum non-linear optical constant can be utilized can be formed in the capillary tube.

Furthermore, the embodiments shown in FIGS. 10 to 15 and FIG. 28 can also be combined so that the crystal orientation of the single crystal can be controlled more stably.

Capillary tube 2a which can be used in this embodiment is made of a heat resistant material exhibiting no non-linear optical effects, such as quartz glass, lead glass, and soda-lime glass. Capillary tube 2a usually has an inner diameter of from 1 to 3 μm.

Organic crystal materials which can be used in this embodiment include MNA, 4,5-dimethyl-1,3-dithiol-2-ylidene cyanoacetate, 1,3-dithiol-2-ylidene cyanoacetate, 3,5-dimethyl-1-(4-nitrophenyl)pyrazole, 3-(2-cyano-2-ethoxycarbonylvinyl)-indole,2-(2-cyanoethoxy)-5-nitropyridine-4'-nitrobenzylidene-3-acetamido-4-methoxyaniline, and molecular salts represented by formula (II):

wherein X represents a methyl group or a chorine atom.

Examples of suitable solvents of solution 8 include water, toluene, methanol, acetonitrile, dimethylformamide, nitrobenzene, dimethyl sulfoxide, dioxane, ethanol, acetone, ethyl acetate, chloroform, benzene, carbon tetrachloride, tetrahydrofuran, and pyridine.

The above-described embodiment can be taken advantage of for the production of a single mode wavelength converting element having a core-sheath structure as shown in FIG. 32 in the same manner as described above with respect to the first and second embodiments using a fused liquid.

Figure 21:
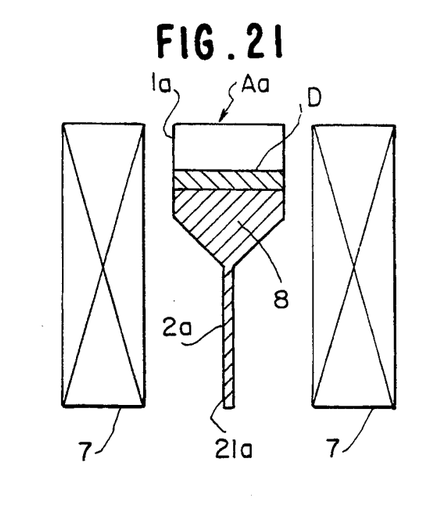

In cases where the solvent having dissolved therein the organic crystal material has a high boiling point, the vapor pressure of the solvent hardly rises even under heating with liquid reservoir 1a closed, making it difficult to fill capillary tube 2a with solution 8. This being the case, liquid D having a lower specific gravity than the solvent, immiscible with the solvent, and having a low boiling point is put in liquid reservoir 1a together with solution 8, and the top opening of reservoir 1a is then sealed. Liquid D in liquid reservoir 1a exists on solution 8 without being mixed with solution 8 as illustrated in FIG. 21. Upon heating growth cell Aa under such a situation, solution 8 of the organic crystal material can easily be filled in capillary tube 2a by the vapor pressure of liquid D having a low boiling point.

Figure 22:
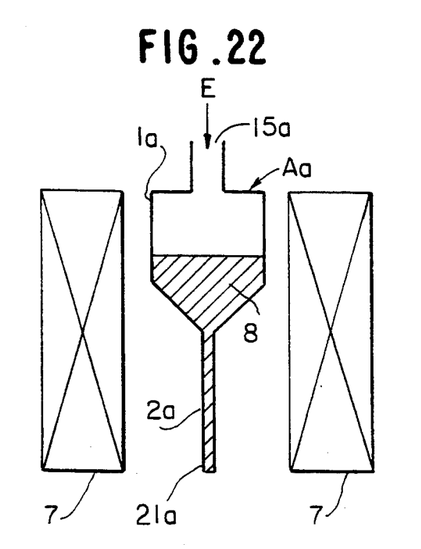

Further, after solution 8 is charged in liquid reservoir 1a, inlet 15a for gas introduction is provided on the top of liquid reservoir 1a, and gas E inert to solution 8, e.g., argon gas and nitrogen gas, is blown into liquid reservoir 1a to increase the inner pressure to thereby fill solution 8 in capillary tube 2a as shown in FIG. 22.

Figure 23:
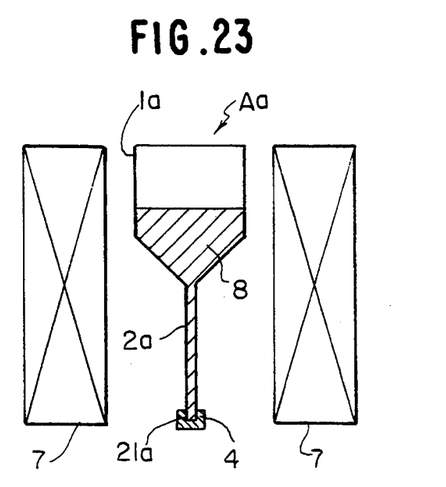

In the fourth embodiment of the present invention, after filling solution 8 to lower end 21a of capillary tube 2a, solution 8 may be brought into contact with the lower end 21a, to provide seed crystal 4 as shown in FIG. 23, and growth cell Aa is slowly shifted down to get out of the heating zone of heating furnace 7 whereby capillary tube 2a is slowly cooled successively from lower end 21a toward the upper end.

In this embodiment, it is preferred that the liquid reservoir is sealed after charging the solution in the reservoir and the capillary tube; the solution of an organic crystal material is heated to a temperature not lower than the boiling point of a solvent contained in the solution so as to completely dissolve the organic crystal material in the solution; and one end of the capillary tube is opend so that the solution is drained from the capillary tube, and simultaneously the temperature of the end of the capillary tube is rapidly reduced or the solvent of the solution at the end of the capillary tube is evaporated, so as to attach the seed crystal at the end of the capillary tube.

As a modification of the fourth embodiment, seed crystal 4 may be previously provided at the lower end of capillary tube 2a with lower end 21a not closed, and single crystal 5 is then allowed to grow based on the seed crystal 4.

Similarly to the first and second embodiments, instead of the rapid or slow shift down of growth cell Aa, heating furnace may be provided in a vertically movable way and rapidly or slowly lifted. Namely, any construction may be used as long as capable of rapid cooling and slow cooling of the solution of an organic crystal material.

In another modified embodiment, solution 8 may be filled in capillary tube 2a while only lower end 21a of capillary tube 2a being outside the heating zone of heating furnace 7 to precipitate seed crystal 4 in the lower end 21a.

Figures 24, 25, 26:
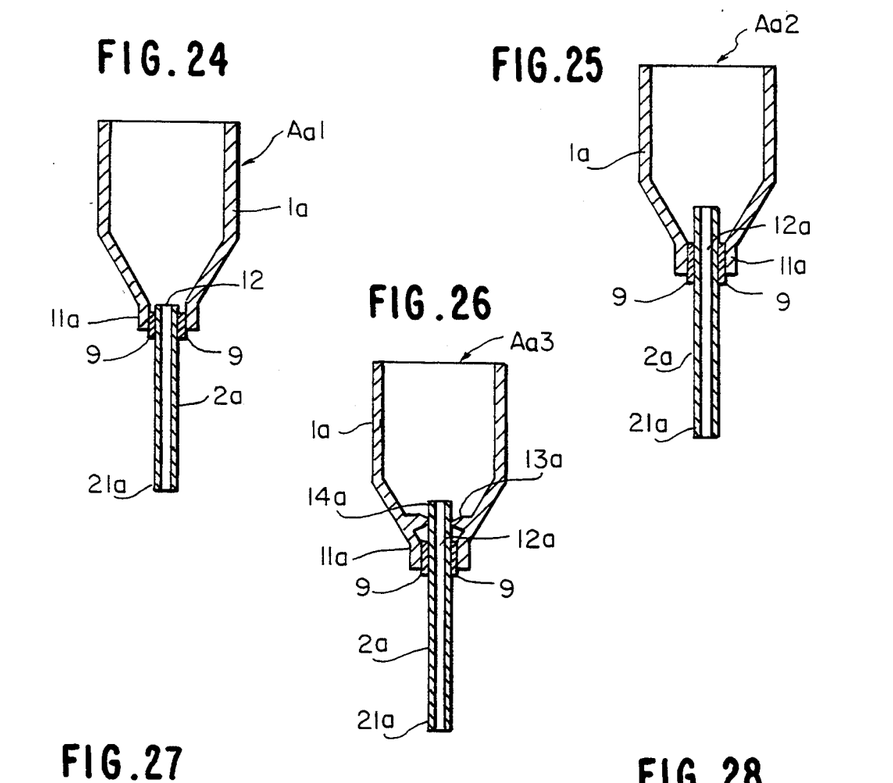

Growth cell Aa as described above by referring to FIGS. 16 through 23 is the one which is produced by integral forming of liquid reservoir 1a and capillary tube 2a and, therefore, has disadvantages of a high reject rate and a low yield. Hence, liquid reservoir 1a of a Buchner funnel shape (with a tapered bottom) having through-hole 2a at the bottom and capillary tube 2a may be produced separately and then connected together by inserting one end of capillary tube 2a through the through-hole 2a and adhering the joint to construct growth cell Aa1 as illustrated in FIG. 24. Such growth cell Aa1 can be produced without requiring difficult production steps.

Liquid reservoir 1a has Buchner funnel shape with a tapered bottom, and through-hole 12a is provided at bottom portion 11a thereof.

Liquid reservoir 1a is made of glass, metals, synthetic resins, etc. which are resistant to the heating by heating furnace 7 and resistant to the solvent of solution 8.

Capillary tube 2a is an open-ended tube made of glass and usually has an inner diameter of from 1 to 3 μm. Glass for constructing capillary tube 2a includes lead glass, soda-lime glass, potash-lime glass, barium glass, and borosilicate glass. The upper open end of capillary tube 2a is inserted into through-hole 12a and adhered thereto with adhesive 9. The adhesive to be used for connecting liquid reservoir 1a and capillary tube 2a should not be dissolved in solution 8 and have high heat resistance, such as epoxy resin adhesives and urethane adhesives.

To prevent the liquid component of adhesive 9 from adhering to the inner wall of capillary tube 2a or entering into the inside of the capillary tube 2a, the capillary tube may be adhered to through-hole 12a with the tip thereof projecting inside liquid reservoir 1a so as to have a cross-section Aa2 of FIG. 25.

Further, as shown in FIG. 26, projection(s) 13a may be provided on the inner wall of liquid reservoir 1a and above through-hole 12a either continuously or at given intervals along the periphery to form hole 14a, and capillary tube 2a is inserted into hole 14a surrounded by projection(s) 13a and thus held at two positions, i.e., at hole 14a and through-hole 12a. According to this modification providing growth cell Aa3, straightness of capillary tube 2a can be assured, and the tube is thus vertically held.

Figure 27:
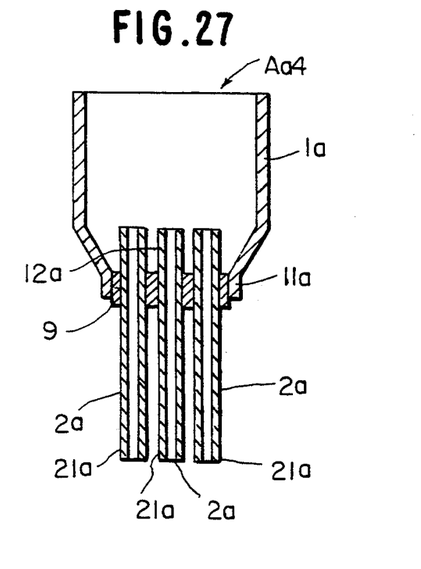

A plurality of capillary tubes 2a may be connected to liquid reservoir 1a with adhesive 9 to prepare growth cell Aa4 of FIG. 27. By using growth cell Aa4, a plurality of single crystals can be produced at a time to greatly improve productivity.

Instead of adhering capillary tube 2a to liquid reservoir 1a with adhesive 9, they may be connected by fusion bonding.

Figure 28:
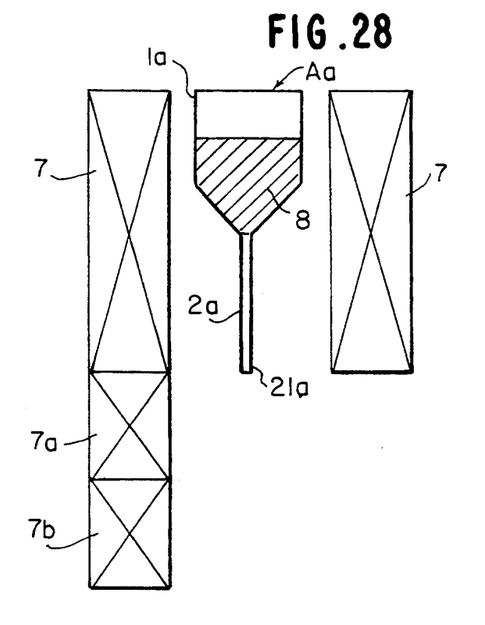

Heating furnace 7 which can be used in the above described third and fourth embodiments may have provided thereunder second heating furnace 7a having the same temperature as heating furnace 7 and of such a shape that only a half side of growth cell Aa may be heated and also have provided under second heating furnace 7a third heating furnace 7b of the same shape as second heating furnace 7a and having a temperature lower than that of second heating furnace 7a as illustrated in FIG. 28. According to this modified apparatus, slow cooling of capillary tube 2a in a successive manner from one end toward the other end can be performed while providing a temperature gradient from the inner wall on one side of the tube toward the inner wall on the opposite side, whereby single crystal 5 grows in the direction of from one side of the inner wall toward the other side along the temperature gradient.

Accordingly, by changing the direction of the temperature gradient, the crystal orientation of single crystal 5 can be controlled, and single crystal 5 whose maximum non-linear optical constant can be made use of can be obtained. The crystal orientation control can be made easier by increasing the temperature gradient.

If desired, in any of the above-described apparatus, the inner surface of capillary tube 2 or 2a may be modified by surface treatment with a coupling agent.

The coupling agent reacts with hydroxyl groups on the glass surface of capillary tube 2 or 2a to form a coupling agent layer chemically bonded to the glass surface. Since this layer possesses different properties from the glass surface, single crystal 5 having grown in capillary tube 2 or 2a having a modified inner wall has a different crystal orientation from that of a single crystal having grown in a capillary tube having an unmodified inner wall. In other words, crystal orientation of single crystal 5 can be varied by selecting the coupling agent for modifying the inner wall of the capillary tube. Thus, an organic crystal whose maximum wavelength covnerting constant can be made use of can be formed in such a modified capillary tube.

The present invention is now illustrated in greater detail with reference to the following Examples, but it should be understood that the present invention is not construed as being limited thereto.

EXAMPLE 1

A fused liquid of NPPA was charged in an ampule having an inner diameter of 6 mm to a height of 5 mm from the bottom.

Ten capillary tubes made of heat resistant glass ("Pyrex" manufactured by Corning Glass Works) having an outer diameter of 500 $\mu$m and an inner diameter of from 2 to 5 $\mu$m were placed in the ampule. The ampule was once cooled to cause crystallization.

The NPPA was again fused, and the ampule was sealed while evacuating using a vacuum pump to thereby fill the capillary tube with the fused liquid of NPPA.

The capillary tube and the ampule were shifted down at a speed of 1.5 mm/hr so as to get out of the heating zone of a heating furnace (high-temperature part: 125° C.; low-temperature part: room temperature) to thereby slowly cool the fused liquid in the capillary tube successively from the lower end toward the upper end.

After the slow cooling, the capillary tube was taken out of the ampule and observed with a polarizing microscope. It was found that a single crystal region of several tens millimeters was formed in all of the ten tubes.

Then, a 1 cm-long sample was cut out of the single crystal region formed in one of the tubes. When an Nd-YAG laser beam having a wavelength of 1.064 $\mu$m was transmitted through the sample from one end thereof, it was ascertained by a spectrum analyzer that a secondary harmonic of 0.532 $\mu$m generated at the other end.

EXAMPLE 2

Crystal powders of 9-methylcarbazole-3-carboxaldehyde obtained by recrystallization were charged in an ampule having a tapered bottom having an inner diameter of 6 $\mu$m to a height of 3 cm from the bottom, and ten capillary tubes, the same as those used in Example 1, were placed in the ampule.

After the ampule was sealed under evacuation, it was placed in a heating furnace (high-temperature part: 100° C.; low-temperature part: room temperature) in such a manner that the polycrystals in the liquid reservoir of the ampule might not be fused, to thereby fuse the crystal material in the capillary tube.

Then, the capillary tube and the ampule were shifted down at a speed of 1 mm/hr to get out of the heating zone of the heating furnace whereby the fused liquid in the capillary tube was slowly cooled successively from the lower end toward the upper end.

After the slow cooling, the capillary tube was taken cut of the ampule and observed with a polarizing microscope. As a result, it was found that a single crystal region of several tens millimeters was formed in all of the ten tubes.

A 1 cm-long sample was cut out of the single crystal region in one of the tubes, and an Nd-YAG laser beam having a wavelength of 1.064 $\mu$m was transmitted through the sample from one end thereof. It was ascertained with a spectrum analyzer that a secondary harmonic having a wavelength of 0.532 $\mu$m generated at the other end.

EXAMPLE 3

A glass-made crystal growth cell comprising a capillary tube (inner diameter: 5.0 $\mu$m; outer diameter: 1 mm; length: 20 cm) at the lower part and a liquid reservoir (inner diameter: 4 mm; outer diameter: 6 mm; length: 10 cm) at the upper part was employed.

A solution of 0.010 g of 4,5-dimethyl-1,3-dithiol-2-ylidene cyanoacetate in 0.1 ml of methanol was charged in the liquid reservoir of the cell placed in a heating furnace at 80° C., and the open top of the liquid reservoir was sealed. After the solution was filled in the capillary tube by the vapor pressure of methanol, the growth cell was rapidly shifted down until the lower tip of the capillary tube was 1 cm lower than the heating zone to quench the lower part of the capillary tube, whereby crystals of 4,5-dimethyl-1,3-dithiol-2-ylidene cyanoacetate were precipitated in this part.

The growth cell was then slowly shifted down at a speed of 3 mm/hr to get out of the heating zone. Thus, the capillary tube was slowly cooled successively toward the upper end whereby a single crystal of 4,5- dimethyl-1,3-dithiol-2-ylidene cyanoacetate grew in the solution starting from the polycrystals as a seed crystal.

After the single crystal grew to form a single crystal region of a prescribed length, the whole growth cell was drawn from the heating zone.

A 1 cm-long sample was cut out of the single crystal region formed in the capillary tube, and an Nd-YAG laser beam having a wavelength of 1.064 μm was transmitted therefrom from one end thereof. It was ascertained with a spectrum analyzer that a secondary harmonic of 0.532 μm generated at the other end.

EXAMPLE 4

A glass-made crystal growth cell comprising a capillary tube (inner diameter: 2.5 μm; outer diameter; 1 mm; length; 10 cm) at the lower part and a liquid reservoir (inner diameter: 4 mm; outer diameter: 6 mm; length: 10 cm) at the upper part was employed.

A solution of 0.04 g of 2-(2-cyanoetheoxy)-5-nitrophyridine in 0.1 ml of acetonitrile was charged in the liquid reservoir of the cell placed in a heating furnace at 120° C., and the open top of the liquid reservoir was sealed. After the solution was filled in the capillary tube by the vapor pressure of acetonitrile, the growth cell was rapidly shifted down until the lower tip of the capillary tube was 1 cm lower than the heating zone to quench the lower part of the capillary tube, whereby polycrystals of 2-(2-cyanoethoxy)-5-nitropyridine were precipitated in this part.

The growth cell was then slowly shifted down at a speed of 0.5 mm/hr to get out of the heating zone. Thus, the capillary tube was slowly cooled successively toward the upper end whereby a single crystal of 2-(2-cyanoethoxy)- 5-nitropyridine grew in the capillary tube starting from the polycrystals as a seed crystal.

After the single crystal grew to form a single crystal region of a prescribed length, the whole growth cell was drawn from the heating zone and allowed to cool.

A 1 cm-long sample was cut out of the single crystal region formed in the capillary tube, and an Nd-YAG laser beam having a wavelength of 1.064 μm was transmitted therefrom from one end thereof. It was ascertained with a spectrum analyzer that a secondary harmonic of 0.532 μm generated at the other end.

EXAMPLE 5

A glass-made crystal growth cell comprising a capillary tube (inner diameter: 2.5 μm; outer diameter: 1 mm; length: 10 cm) at the lower part and a liquid reservoir (inner diameter: 4 mm; outer diameter: 6 mm; length: 10 cm) at the upper part was employed.

A solution of 0.15 g of 3,5-dimethyl-1-(4-nitrophenyl)pyrazole having a fusion point of 100° C., in 0.1 ml of acetonitrile was charged in the liquid reservoir of the cell placed in a heating furnace at 120° C., and the open top of the liquid reservoir was sealed. After the solution was filled in the capillary tube was by the vapor pressure of acetonitrile, the growth cell was shifted down until the lower tip of the capillary tube was 1 cm lower than the heating zone to quench the lower part of the capillary tube, whereby polycrystals of 3,5-dimethyl-1-(4-nitrophenyl)pyrazole were precipitated in this part. The polycrystals were precipitated at 57° C.

The growth cell was then slowly shifted down at a speed of 0.3 mm/hr to get out of the heating zone. Thus, the capillary tube was slowly cooled successively toward the upper end whereby a single crystal of 3,5-dimethyl-1-(4-nitrophenyl)pyrazole grew in the capillary tube starting from the polycrystals as a seed crystal.

After the single crystal grew to form a single crystal region of a prescribed length, the whole growth cell was drawn down from the heating zone and allowed to cool.

A 1 cm-long sample was cut out of the single crystal region formed in the capillary tube, and an Nd-YAG laser beam having a wavelength of 1.064 μm was transmitted therefrom from one end thereof. It was ascertained with a spectrum analyzer that a secondary harmonic of 0.532 μm generated at the other end.

The loss of the Nd-YAG laser beam through the transmission was found to be 3.0 dB/cm, which was the half of that of a sample comprising a single crystal prepared from a fused liquid of 3,5-dimethyl-1-(4-nitrophenyl)pyrazole as a core.

EXAMPLE 6

A lead glass (SF4) tube having an outer diameter of 22 mm and an inner diameter of 3 mm was stretched by heating in an electrical furnace and then formed into a capillary tube having an outer diameter of 500 μm and an inner diameter of 5 μm by heating on a gas burner. The yield of the capillary tube was 80%.

A heat resistant glass tube having an outer diameter of 6 mm and an inner diameter of 4 mm was formed by heating on an oxygen burner to form a liquid reservoir having a tapered bottom having a through-hole. Further, a continuous ring projection was provided on the inner side of the liquid reservoir.

The capillary tube was inserted through the through-hole of the hole reservoir and also through the hole formed by the ring projection so as to be held at two positions of the through-hole and the ring projection. The capillary tube was adhered to the through-hole with an epoxy resin adhesive to prepare a crystal growth cell.

A solution of 0.05 g of 4,5 -dimethyl-1,3-dithiol-2-ylindene cyanoacetate in 0.1 ml of acetonitrile was charged in the liquid reservoir of the growth cell, and the top of the liquid reservoir was sealed.

The growth cell was set in a cylinderical heater kept at 120° C. in a vertically movable way. After the solution was filled in the capillary tube by the vapor pressure of acetonitrile, the capillary tube was shifted down to bring only the lower end thereof outside the heating zone of the heater. The lower end was thus quenched to precipitate a seed crystal of 4,5-dimethyl-1,3-dithiol-2-ylidene cyanoacetate.

The growth cell was then shifted down at a speed of 0.1 mm/hr to get outside the heating zone. One week layer, a single crystal was precipatated in the capillary tube.

When a semi-conductor laser beam of 860 nm was transmitted through the resulting single crystal, generation of a secondary harmonic was observed by a spectrum analyzer.

From the results of Example 1 and 2, it can be seen that a single crystal can be produced from an organic crystal material fused liquid which hardly crystallizes by the process of the present invention in which a large quantity of a fused liquid is used for precipitation of a seed crystal or a seed crystal is previously provided in contact with a fused liquid and then the seed crystal is allowed to grow in the fused liquid starting from the seed crystal.

From the results of Examples 3 and 4, it can be seen that the process of this invention in which a single crystal is allowed to grow from a solution of an organic crystal material makes it possible to produce an organic crystal exhibiting secondary non-linear optical effects by using an organic crystal material which does not exhibit secondary non-linear optical effects when precipitated from a fused liquid thereof or an organic crystal material which exhibits secondary non-linear optical effects only when crystallized from a solultion thereof.

It can further be seen from the results of Example 5 that the process of this invention in which a single crystal is allowed to grow from a solution of an organic crystal material makes it possible to produce an organic crystal which causes a reduced loss of a laser beam.

Furthermore, since the growth cell obtained in Example 6 comprises a combination of separately prepared liquid reservoir and capillary tube, it is apparent that the growth cell of this type can be prepared easier and at lower cost as compared with an integrally formed growth cell.

For comparison, twenty attempts were made to obtain a crystal growth cell having a capillary tube of 500 $\mu$m in outer diameter and 5 $\mu$m in inner diameter integrally connected to a liquid reservoir by forming of a lead glass tube of 6 mm in outer diameter and 4 mm in inner diameter on a burner but resulted in only one success. Besides, the capillary tube formed by integral forming had an ellipsoidal cross-section.

EXAMPLE 7

A fused liquid of MNA was charged in an ampule having an inner diameter of 6 mm to a height of 5 mm from the bottom. A heat resistant glass capillary tube having an outer diameter of 500 $\mu$m, an inner diameter of 5 $\mu$m, and a length of 50 mm was put in the ampule thereby to fill the MNA fused liquid in the capillary tube by capillarity, followed by slow cooling to solidify MNA.

The capillary tube was then heated to 145° C. in a heating furnace shown in FIG. 12 to fuse MNA in the capillary tube. The capillary tube was drawn from the heating furnace at a speed of 6 mm/hr to slowly cool the fused liquid in the capillary tube successively from one end thereof toward the other end.

Dichroism of the MNA crystal thus formed in the capillary tube was observed in a light field with a polarizing microscope. As a result, the X axis of the MNA crystal, i.e., the direction of dii, was revealed to be perpendicular to the longer axis of the capillary tube over a length of 100 $\mu$m.

EXAMPLE 8

An MNA fused liquid was filled in a capillary tube and slowly cooled to solidify in the same manner as in Example 7.

The capillary tube was placed in a heating furnace of FIG. 13 and heated at 148° C. to fuse MNA in the capillary tube. The capillary tube was then drawn from the heating furnace at a speed of 5 mm/hr to slowly cool the fused liquid in the capillary tube sucessively from one end toward the other end.

The MNA crystal formed in the capillary tube was observed in the same manner as in Example 7. It was revealed that the X axis of the MNA crystal, i.e., the direction of dii, was perpendicular to the longer axis of the capillary tube over a length of about 4 mm.

Figure 31:
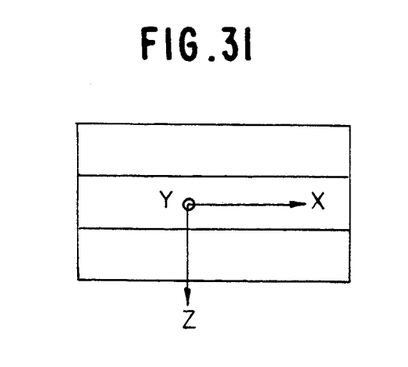
FIG. 31 illustrates a crystal orientation of an MNA single crystal produced by the conventional method.

For comparison, in a fiber type wavelength converting element using the conventional MNA crystal as a core, the X axis of the MNA crystal, i.e., the direction of dii, was found to be parallel with the longer axis of the fiber as shown in FIG. 31.

It can be seen from the results of Examples 7 and 8 that the crystal orientation of a single crystal growing in the capillary tube can be changed by allowing the single crystal to grow with a temperature gradient provided to the diameter direction of the capillary tube.

EXAMPLE 9

A glass-made crystal growth cell comprising a capillary tube (inner diameter: 2.5 $\mu$m; outer diameter: 1 $\mu$mm; length: 10 cm) at the lower part and a liquid reservoir (inner diameter: 4 mm; outer diameter: 6 mm; length: 10 cm) at the upper part as shown in FIGS. 25 or 26 was employed.

A 5 wt % cyclohexane solution of phenyldimethylchlorosilane was charged in the liquid reservoir of the growth cell, and the open top of the liquid reservoir was sealed. The whole cell was heated to 85° C. to fill the solution in the capillary tube by the vapor pressure of cyclohexane, followed by allowing to stand at 85° C. for 3 hours. The top of the liquid reservoir was opened, the solution was discarded, and the cell was thoroughly dried to obtain the capillary tube having a modified inner wall.

Then, a fused liquid of MNA was charged in an ampule having an inner diameter of 5 mm to a height of 5 mm from the bottom.

The above-obtained capillary tube having a modified inner wall was cut from the growth cell to a length of 30 mm and placed in the ampule thereby filling the MNA fused liquid into the capillary tube while evacuating using a vacuum pump.

The ampule was heated to 138° C. in a heating furnace and then drawn from the heating zone of the heating furnace at a speed of 5 mm/hr. The fused liquid in the capillary tube was thus slowly cooled successively from one end thereof toward the other end to allow an MNA single crystal to grow in the capillary tube.

After the single crystal grew to form a single crystal region of a prescribed length, the whole ampule was drawn from the heating zone and cooled.

Figure 30:
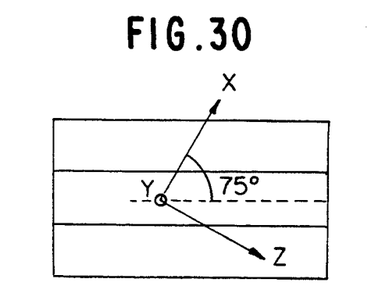
FIG. 30 illustrates a crystal orientation of an MNA single crystal produced by the method of the present invention.

The crystal axis of the resulting single crystal was at an angle of 75° from the longer axis of the capillary tube over a length of about 10 mm as shown in FIG. 30.

EXAMPLE 10

The same growth cell as obtained in Example 9 was employed without cutting the capillary tube having a modified inner wall.

A solution of 0.07 g of 3-(2-cyano-2-ethxoycarbonylvinyl)indole in 0.1 ml of acetonitrile was charged in the liquid reservoir of the growth cell, and the top of the liquid reservoir was sealed. The cell was placed in a heating furnace of 100° C. After the capillary tube was filled with the solution by the vapor pressure of acetonitrile, the growth cell was shifted down until the lower tip of the capillary tube was 1 cm down from the heating zone of the heating furnace to quench the lower end of the capillary tube to thereby precipitate polycrystals of 3-(2-cyano-2-ethoxycarbonylvinyl)-indole in this part.

The growth cell was then shifted down at a speed of 0.1 mm/hr to slowly cool the capillary tube successively from the lower end toward the upper end to allow a single crystal of 3-(2-cyano-2-ethoxycarbonylvinyl)indole to grow starting from the polycrystal as a seed crystal in the solution.

The crystal axis of the resulting single crystal was at 50° from the longer axis of the capillary tube over a length of about 4 mm.

From the results of Examples 9 and 10, it can be seen that the crystal orientation of a single crystal growing in a capillary tube can be changed by modifying the inner wall of the capillary glass tube.

The effects of the present invention are summarized hereunder.

According to the first embodiment, because the amount of a fused liquid to be used for forming a seed crystal is large, a seed crystal can be formed in an organic crystal material fused liquid which hardly crystallizes and be allowed to grow.

According to the second embodiment, since a fused liquid to be used for crystallization is in contact with a seed crystal, a single crystal can grow even in a fused liquid of an organic crystal material which does not crystallize in the absence of a seed crystal.

According to the third and forth embodiments, since a single crystal grows in a solution under control of a crystal form, there is produced a single crystal having no center of inversion symmetry which can be suitably used as a wavelength converting element exhibiting secondary non-linear optical effects. Further, since the organic crystal material is not heat-fused, there is no fear of decomposition of the organic crystal material. Furthermore, because crystal growth is carried out at a temperature below the fusion point, there is produced a single crystal free from lattice defect or rearrangement, causing a reduced loss of a laser beam, and particularly suitable for use as a wavelength converting element.

According to the fifth and sixth embodiments, the crystal orientation of a single crystal of an organic crystal material can be controlled so as to produce a single crystal with which the maximum non-linear optical constant possessed by the organic crystal material can be made use of.

The cell for crystal growth comprising a combination of a liquid reservoir and a capillary tube separately prepared and connected together afterwards can be produced easily and economically in a high yield. Therefore, the cell of this type is suitably employed for carrying out the method of the present invention.

While the invention has been described in detail and with reference to specific embodiments thereof, it will be apparent to one skilled in the art that various changes and modifications can be made therein without departing from the spirit and scope thereof.

What is claimed is:

1. A method for producing an organic crystal which comprises maintain a capillary tube having an inner wall with one side and a side on the opposite side of said one side and having an inner diameter of 1 to 5 $\mu$m containing a fused liquid of an organic crystal material and having a fused liquid reservoir at one end thereof at a temperature not less than the fusion point of said organic crystal material together with the fused liquid reservoir, reducing the temperature of the fused liquid in said fused liquid reservoir to precipitate seed crystals, and then slowly cooling the capillary tube successively from said end toward the other end to allow a single crystal to grow from the seed crystal in the capillary tube, wherein during said slowly cooling a temperature gradient is provided from the inner wall of the capillary tube on said one side toward the inner wall of the capillary tube on said opposite side of said one side to thereby allow the single crystal to grow.

2. A method for producing an organic crystal which comprises maintaining a capillary tube having an inner wall with one side and a side on the opposite side of said one side and having an inner diameter of 1 to 5 $\mu$m containing a fused liquid of an organic crystal material and having a fused liquid reservoir at one end thereof at a temperature not less than the fusion point of said organic crystal material together with the fused liquid reservoir, reducing the temperature of the fused liquid in said fused liquid reservoir while said fused liquid is in contact with a seed crystal which is provided outside the heating zone to thereby allow the seed crystal to grow, and then slowly cooling the capillary tube successively from said end toward the other end to allow a single crystal to grow from the seed crystal in the capillary tube, wherein during said slowly cooling a temperature gradient is provided from the inner wall of the capillary tube on said one side toward the inner wall of the capillary tube on said opposite side of said one side to thereby allow the single crystal to grow.

3. A method for producing an organic crystal which comprises charging a solution of an organic crystal material in a capillary tube under heat, said capillary tube having an inner wall with one side and a side on the opposite side of said one side, rapidly reducing the temperature of one end of the capillary tube to precipitate polycrystals, and then slowly cooling the capillary tube successively from said end toward the other end to allow a single crystal to grow from the polycrystal as a seed crystal.

4. A method as claimed in claim 3, wherein a liquid reservoir containing said solution of an organic crystal material is provided at one end of said capillary tube.

5. A method as claimed in claim 4, wherein said liquid reservoir, which constitute on organic crystal growth cell with said capillary tube, is sealed; said solution of an organic crystal material is heated to a temperature not lower than the boiling point of a solvent contained in said solution so as to completely dissolve said organic crystal material in said solution; and one end of said capillary tube is opend so that said solution is drained from said capillary tube, and simultaneously the temperature of said end of the capillary tube is rapidly reduced or the solvent of the solution at said end of the capillary tube is evaporated, so as to attach said seed crystal at said end of the capillary tube.

6. A method for producing an organic crystal which comprises slowly cooling a capillary tube containing a solution of an organic crystal material under heat, said capillary tube having an inner wall with one side and a side on the opposite side of said one side, and said capillary tube being fitted with a seed crystal at one end thereof so that said solution is in contact with said seed crystal successively from said end toward the other end to allow a single crystal to grow from said seed crystal in the capillary tube.

7. A method as claimed in claim 6, wherein a liquid reservoir containing said solution of an organic crystal material is provided at one end of said capillary tube.

8. A method as claimed in claim 7, wherein said liquid reservoir, which constitute on organic crystal growth cell with said capillary tube, is sealed; said solution of an organic crystal material is heated to a temperature not lower than the boiling point of a solvent contained in said solution so as to completely dissolve said organic crystal material in said solution; and one end of said capillary tube is opend so that said solution is drained from said capillary tube, and simultaneously the temperature of said end of the capillary tube is rapidly reduced or the solvent of the solution at said end of the capillary tube is evaporated, so as to attach said seed crystal at said end of the capillary tube.

9. A method for producing an organic crystal while controlling the crystal direction of the organic crystal which comprises slowly cooling a capillary tube which has a circular cross-section and which contains a fused liquid or solution of an organic crystal material under heat, successively from one end thereof toward the other end with a temperature gradient provided from the inner wall of the capillary tube on one side toward the inner wall on the opposite side to thereby allow a single crystal to grow.

10. A method as claimed in claim 9, wherein a heater is provided on only one side of said capillary tube.

11. A method as claimed in claim 10, wherein said capillary tube containing a fused liquid or solution of an organic crystal material is placed holizontally in a heating furnace comprising a heater at the bottom thereof, an open top, a high-temperature part kept at a temperature higher than the fusion point of said organic crystal material, and a low-temperature part kept at a temperature lower than the fusion point of said organic crystal material; and said capillary tube is moved holizontally from said high-temperature part to said low-temperature part.

12. A method for producing an organic crystal while controlling the crystal direction of the organic crystal which comprises cooling a capillary tube which has a circular cross-section and which contains a fused liquid or solution of an organic crystal material under heat, the inner wall of said capillary tube being modified with a coupling agent, successively from one thereof toward the other end to allow a single crystal to grow.

13. A method as claimed in claim 12, wherein said coupling agent is a silane coupling agent.

14. A method as claimed in claim 13, wherein said coupling agent is a monochlorosilane compound.

15. A method as claimed in claim 14, wherein said coupling agent is dimethylphenylmonochlorosilane.

16. The method of claim 3 wherein said capillary tube has an inner diameter of 5 $\mu$m or less.

17. The method of claim 8 wherein said capillary tube has an inner diameter of 5 $\mu$m or less.

18. A method for producing an organic crystal which comprises maintain a capillary tube having an inner diameter of 5 $\mu$m or less containing a fused liquid of an organic crystal material and having a fused liquid reservoir at one end thereof at a temperature not less than the fusion point of said organic crystal material together with the fused liquid reservoir, reducing the temperature of the fused liquid in said fused liquid reservoir to precipitate seed crystals, and then slowly cooling the capillary tube successively from said end toward the other end to allow a single crystal to grow from the seed crystal in the capillary tube, wherein the inner wall of said capillary tube is modified with a coupling agent.

19. A method for producing an organic crystal which comprises maintaining a capillary tube having an inner diameter of 5 $\mu$m or less containing a fused liquid of an organic crystal material and having a fused liquid reservoir at one end thereof at a temperature not less than the fusion point of said organic crystal material together with the fused liquid reservoir, reducing the temperature of the fused liquid in said fused liquid reservoir while said fused liquid is in contact with a seed crystal which is provided outside the heating zone to thereby allow the seed crystal to grow, and then slowly cooling the capillary tube successively from said end toward the other end to allow a single crystal to grow from the seed crystal in the capillary tube, wherein the inner wall of said capillary tube is modified with a coupling agent.

20. A method for producing an organic crystal which comprises charging a solution of an organic crystal material in a capillary tube under heat, rapidly reducing the temperature of one end of the capillary tube or evaporating the solvent in said solution so as to precipitate polycrystals, and then slowly cooling the capillary tube successively from said end toward the other end to allow a single crystal to grow from the polycrystal as a seed crystal, wherein the inner wall of said capillary tube is modified with a coupling agent.

21. A method for producing an organic crystal which comprises slowly cooling a capillary tube containing a solution of an organic crystal material under heat, said capillary tube being fitted with a seed crystal at one end thereof so that said solution is in contact with said seed crystal successively from said end toward the other end to allow a single crystal to grow from said seed crystal in the capillary tube, wherein the inner wall of said capillary tube is modified with a coupling agent.

* * * * *